(12) United States Patent
Sindalovsky

(10) Patent No.: US 6,320,442 B1
(45) Date of Patent: Nov. 20, 2001

(54) DUAL CLOCK D TYPE FLIP-FLOP

(75) Inventor: Vladimir Sindalovsky, Perkasie, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/241,073

(22) Filed: Feb. 1, 1999

Related U.S. Application Data

(60) Provisional application No. 60/097,922, filed on Aug. 25, 1998.

(51) Int. Cl.[7] .................................................. H03K 3/356
(52) U.S. Cl. ............................................. 327/218; 327/212
(58) Field of Search ................................. 327/199, 200, 327/201, 212, 218, 144

(56) References Cited

U.S. PATENT DOCUMENTS 5,327,019 * 7/1994 Kluch ................................... 327/218
5,894,213 * 4/1999 Nakamura .......................... 340/146.2
5,896,052 * 4/1999 Gujral et al. .......................... 327/144

* cited by examiner

Primary Examiner—Tuan T. Lam
(74) Attorney, Agent, or Firm—William H. Bollman

(57) ABSTRACT

The present invention provides a dual clock D type flip-flop which outputs an active signal after the occurrence of an event on a first data input line triggered by an edge (e.g., a rising edge) of a first clock signal. Thereafter, the output is unchanged by the state of the first data input line and/or the first clock signal until an event is detected on the second data input line based on a second clock signal. The output remains active until the occurrence of another event on the second data input line triggered by an edge (e.g., a rising edge) of the second clock signal. Thereafter, the output remains unchanged by the state of the first data input line and/or the first clock signal until an event is again detected on the first data input line based on the first clock signal. Thus, the dual clock D type flip-flop operates on two separate clock signals and/or data signals without incurring latencies normally present with prior art circuits.

24 Claims, 5 Drawing Sheets

DUAL CLOCK D TYPE FLIP-FLOP

This application claims benefit to provisional application No. 60/097922, filed Aug. 25, 1998.

BACKGROUND OF THE INVENTION

1. Field of the Invention

This invention relates generally to flip-flops. More particularly, it relates to a dual clock D type flip-flop circuit capable of operating on two clock signals with respective two input data signals.

2. Background of Related Art

A D type flip-flop is an integrated circuit device which latches for output an input signal based on a rising or falling edge of an input clock signal. Many circuits often include a D type flip-flop, which is depicted schematically in FIG. 4.

In particular, FIG. 4 shows a schematic symbol for a conventional D type flip-flop 400. The D type flip-flop 400 includes one input signal D, an output signal Q, and one clock signal CLK. The D type flip-flop 400 further includes the ability to have its output Q preset with a predetermined condition upon reset using a preset PRE line, as well as the ability to be reset using a clear CLR line.

D type flip-flops have been in existence for decades, and have many, many uses, most typically in latching a data signal for output based on an edge of a clock signal. However, there are situations wherein it is desired to provide a single output event based on the occurrence of two input signals each having its own clock signal.

There are cases, especially in state machines and interface logic, when it is desirable to build a flip-flop device which is capable of switching on the edges of two different clocks. For instance, such a device would be useful in a state machine which is to be turned on when one particular condition holds true at the time of a first rising clock signal, e.g., on a first clock edge, and turned off when some other condition holds true at the time of a second clock signal, e.g., on a falling clock edge.

A second example of a situation for using a flip-flop inputting two separate clock signals would be if gated clocks are used for two different blocks of a device, and there is an inherent (and not very controllable) skew between the two clock signals. Then, if some signal is generated in one block and used in another block, it would be useful to set this signal based on one edge (e.g., a rising edge) of a clock signal to the first block, and resetting it on the edge of a clock signal to the second block.

Yet another example would be if an interface device needs to toggle a signal on the rising edges of two asynchronous clock signals. In this case, instead of synchronizing every input signal coming from an independently clocked device, it would be convenient to use a dual clock D flip-flop in accordance with the principles of the present invention.

There is thus a need for a D type flip-flop device which is capable of operation based on two input signals clocked independently by two clock signals.

SUMMARY OF THE INVENTION

In accordance with the principles of the present invention, a dual clock flip-flop comprises a first single clock flip-flop adapted to change a state of an output signal thereof based on an occurrence of an event on a data line input thereto as determined by a clock signal input thereto. A second single clock flip-flop is adapted to change a state of an output signal thereof based on an occurrence of an event on a data line input thereto as determined by a clock signal input thereto. A logic circuit provides an output data signal of the dual clock flip-flop comprising an exclusive OR of the output signal of the first single clock flip-flop and the output signal of the second single clock flip-flop.

In accordance with another aspect of the present invention, a dual clock D type flip-flop comprises means for outputting an active signal after an occurrence of a first event on a first data input line triggered by an edge of a first clock signal. The dual clock D type flip-flop further comprises means for maintaining a state of the output active signal until a second event is detected on a second data input line based on a second clock signal, and means for deactivating the output signal upon the detection of the second event on the second data input line based on the second clock signal.

A method of indicating a detection of two signal events in accordance with the principles of the present invention comprises providing an active output signal upon a first event of an edge of a first clock signal occurring during an activation of a first data signal. The output signal is deactivated upon a second event of an edge of a second clock signal occurring during an activation of a second data signal. After each first event, the output signal is prevented from being affected by the first clock signal and the first data signal until after a subsequent second event has occurred. After each second event, the output signal is prevented from being affected by the second clock signal and the second data signal until after a subsequent first event has occurred.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides a dual clock D type flip-flop circuit based on standard library cells which in turn forms the basis for a new library cell. The dual clock D type flip-flop is capable of operation based on triggering by two different clock signals which may operate on two different input data signals.

Figure 1:
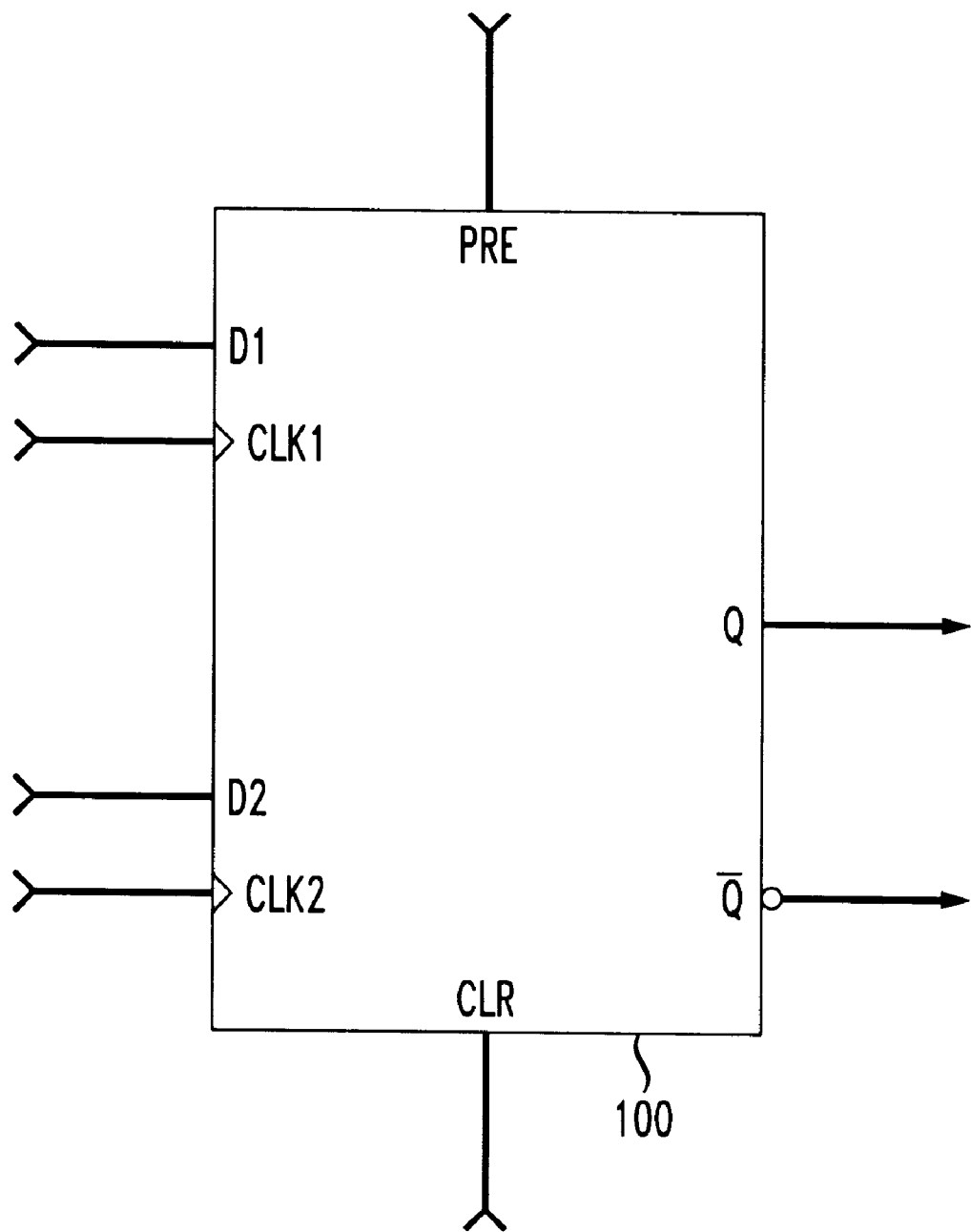
FIG. 1 shows a schematical representation of a dual clock D type flip-flop in accordance with the principles of the present invention.

FIG. 1 shows a schematical symbol representing a dual clock D type flip-flop in accordance with the principles of the present invention.

In FIG. 1, the dual clock D type flip-flop 100 includes an output line Q, an inverted output line /Q, a first data input line DI together with a corresponding first clock input signal line CLK1, a second data input line D2 together with a corresponding second clock input signal line CLK2.

If desired, the dual clock D type flip-flop 100 should include a preset line PRE and/or a clear line CLR. As is known in the art, the preset line PRE and/or the clear line CLR may be tied high (or low) as necessary to override the respective function.

Figure 2:
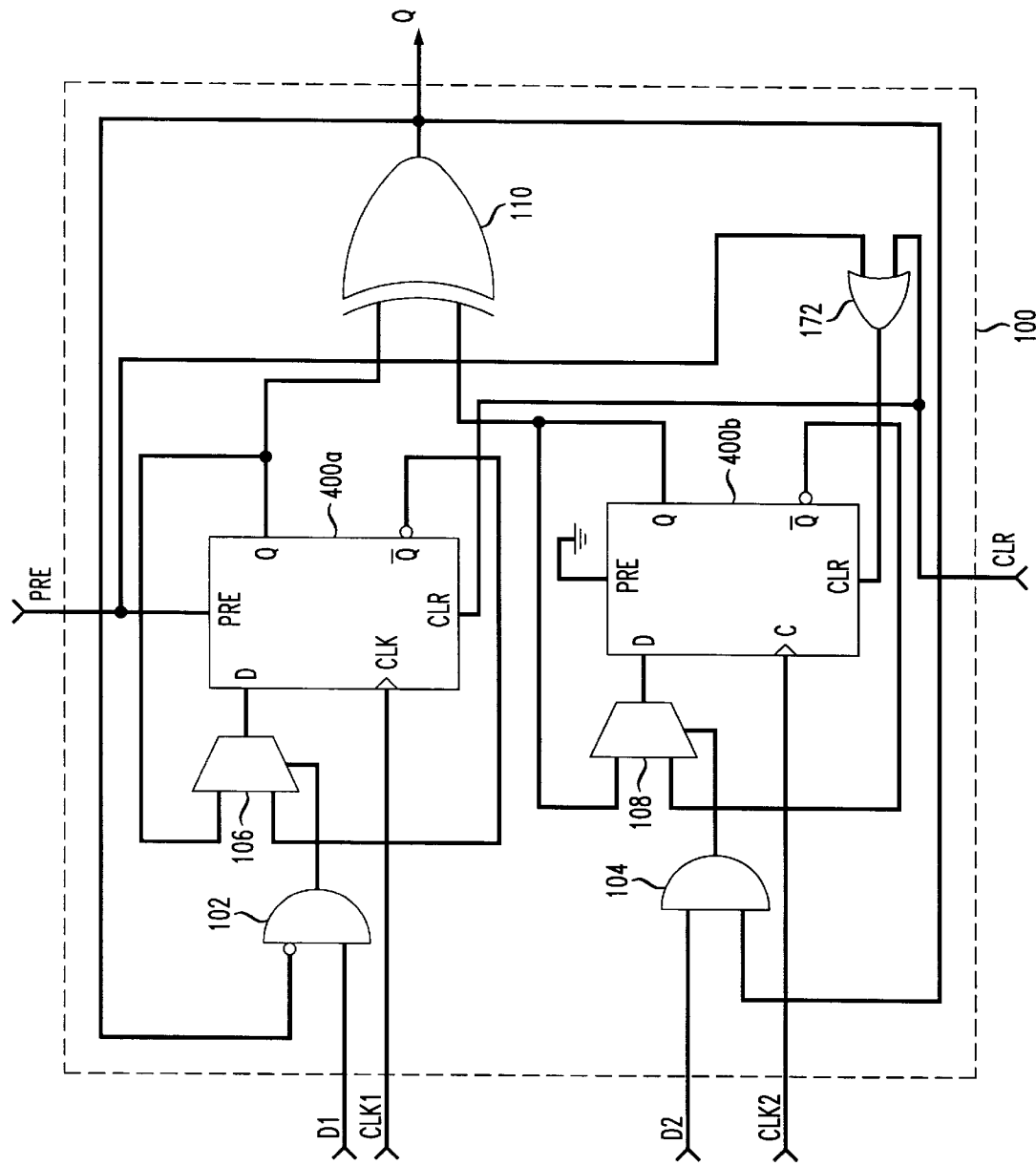
FIG. 2 is a circuit diagram of one embodiment of a dual clock D type flip-flop shown in FIG. 1

FIG. 2 shows one implementation of a dual clock D type flip-flop as shown in FIG. 1. In FIG. 2, the inputs DI, D2, CLK1, CLK2, PRE and CLR as shown in FIG. 2 correspond to the same signals shown in FIG. 1.

In particular, the dual D type flip-flop shown in FIG. 2 includes two conventional single clock D type flip-flops 400a, 400b, an exclusive OR gate 110 to exclusively OR the output signals Q from each of the single clock D type flip-flops 400a, 400b and thus provide an output Q from the dual clock D type flip-flop 100.

The first clock signal CLK1 is input to the clock input line CLK of the first single D type flip-flop 400a, while the second clock signal CLK2 is input to the clock input line CLK of the second single D type flip-flop 400b.

With respect to the first clock signal CLK1 and first data line D1, the first data input line D1 is input to a first AND gate 102. The other input of the first AND gate 102 receives an inversion of the output Q of the dual D type flip-flop 100. The output of the first AND gate 102 controls the position of a first two input, single output multiplexer 106. A first input to the first multiplexer 106 is connected to the output line Q of the first single D type flip-flop 400a, while the other input to the first multiplexer 106 is connected to an inversion of the output line /Q.

Similarly, with respect to the second clock signal CLK2 and second data line D2, the second data input line D2 is input to a second AND gate 104. The other input of the second AND gate 104 receives the output Q of the dual D type flip-flop 100. The output of the second AND gate 104 controls the position of a second two input, single output multiplexer 108. A first input to the second multiplexer 108 is connected to the output line Q of the second single D type flip-flop 400b, while the other input to the second multiplexer 108 is connected to an inversion of the output line /Q.

FIG. 2 further shows an embodiment utilizing the preset PRE and clear CLR lines. In particular, the preset PRE and clear CLR inputs to the dual clock D type flip-flop 100 are presented to the first single D type flip-flop 400a. The preset PRE of the second single D type flip-flop 400b is tied to an inactive position, e.g., to ground if active high. An OR gate 172 is used to present a clear CLR signal to the second single D type flip-flop 400b when either a clear signal or a preset signal is presented to the dual clock D type flip-flop 100. Thus, when preset, the dual clock D type flip-flop 100 will output a logic HIGH level, and when reset with a clear signal the dual clock D type flip-flop 100 will output a logic LOW level.

It is desirable for the purposes of simulating the dual clock D type flip-flop shown in FIG. 2 that the skew between the two clock signals CLK1 and CLK2 be predictable, either positive or negative, and that no metastability condition can occur.

Figure 3:
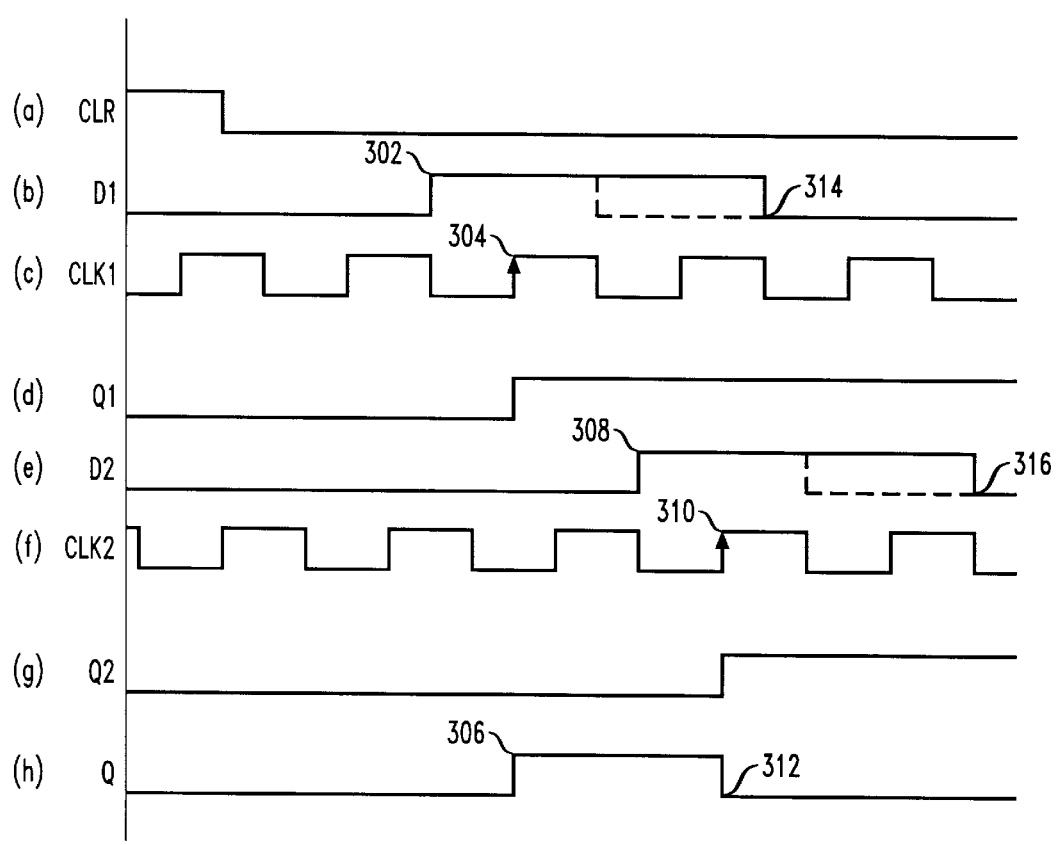
FIG. 3 is a timing diagram useful for describing the operation of the dual clock D type flip flop shown in FIGS. 1 and 2.
Figure 4:
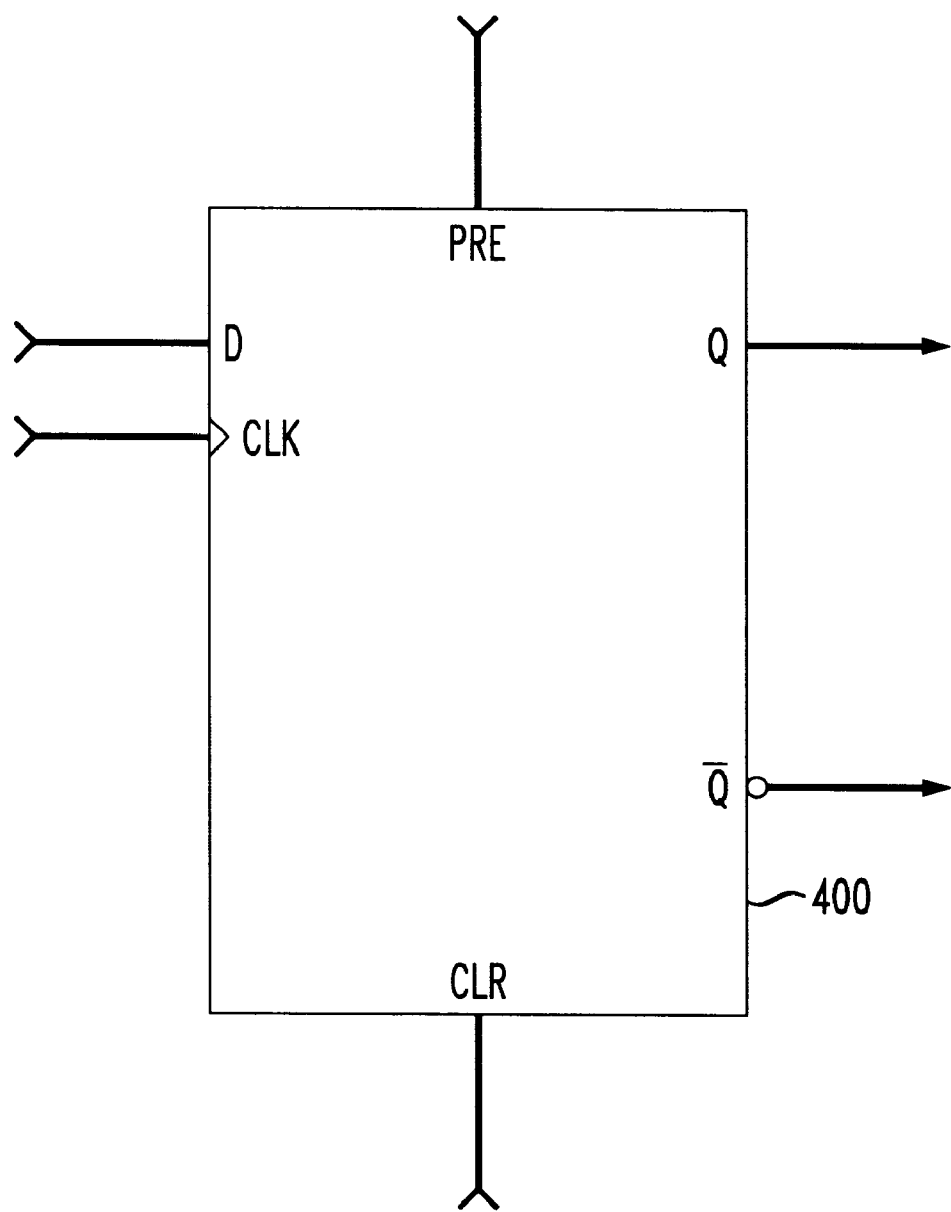
FIG. 4 shows a conventional single clock D type flip-flop.

FIG. 3 shows waveforms of signals relating to the embodiments of FIGS. 1 and 2. In FIG. 3, the overall output signal Q of the dual clock D type flip-flop is asynchronously set to a zero after an active reset clear signal is applied.

For simplicity of description, FIG. 3 assumes that a skew of about ¼ of a period of the clock signals exists between the clock signals CLK1 and CLK2, and that the two clock signals CLK1 and CLK2 are synchronous and constant. Of course, these limiting conditions are used only for explanation of the present embodiment only, and are in no way to be interpreted as limiting either the described embodiment or the present invention as a whole. For instance, the present invention clearly applies to either synchronous or asynchronous clock signals CLK1 and CLK2, and/or synchronous or asynchronous data input signals D1 and D2. A possible metastability condition is discussed in more detail later.

In the disclosed embodiment, the clear signal CLR is active high as shown in waveform (a) of FIG. 3. Thus, in operation, when the clear signal CLR is set high, both single clock D type flip-flops 400a, 400b shown in FIG. 2 are reset to a zeroed state, i.e., having logic LOW levels on their respective output lines Q. The overall output Q of the dual clock D type flip-flop 100 is generated by the exclusive ORing of the respective output signals Q of the single clock D type flip-flops 400a, 400b.

If both input signals D1, D2 to the dual clock D type flip-flop are maintained at a low level as shown in the beginning portion of waveforms (b) and (e) of FIG. 3, the outputs of the AND gates 102, 104 become low, respectively controlling both multiplexers 106, 108 to pass the output signals Q of the respective single clock D type flip-flops 400a, 400b to the corresponding inputs D of the same single clock D type flip-flops 400a, 400b. Thus, in this condition, the single clock D type flip-flops 400a, 400b maintain their low or zeroed state, and the output Q of the overall dual clock D type flip-flop 100 is held at a logic low level, as shown in the beginning portion of waveform (h) in FIG. 3.

When the condition of the first input signal D1 to the overall dual clock D type flip-flop 100 changes to a logic HIGH level at point 302 in waveform (b) shown in FIG. 3, the output of the first AND gate 102 changes to a logic HIGH level, and the first multiplexer 106 passes the inverted output /Q of the first single clock D type flip-flop 400a to its own input D.

Then, on the first rising edge 304 of the first clock pulse CLK1 after the first input signal D1 is set to a logic HIGH level at point 302, the first single clock D type flip-flop 400a changes its output state, and the overall output signal Q of the exclusive OR 110 changes to a logic HIGH level as shown at point 306 in waveform (h) of FIG. 3, reflecting the odd combination of the logic states of the first and second single clock D type flip-flops 400a, 400b. This causes the output of the first AND gate 102 to go to a logic LOW level, and the first multiplexer 106 to pass the output signal Q of the first single clock D type flip-flop 400a to the input D of the first single clock D type flip-flop 400a. Thereafter, subsequent rising edges of the first clock signal CLK1 do not change the logic state of the output of the first single D type flip-flop 400a.

When the second input signal D2 changes to a logic HIGH level at point 308 in waveform (e) shown in FIG. 3, the state of the second single clock D type flip-flop 400b toggles the same way as did the first single clock D type flip-flop 400a, but on the rising edge 310 of the second clock signal CLK2 shown in waveform (f) in FIG. 3 instead of on the first clock signal CLK1 as did the first single clock D type flip-flop 400a. The combination of the respective output signals Q first and second single clock D type flip-flops 400a, 400b changes to an 'even' condition (i.e., they are both the same), and thus, the exclusive ORing performed by the exclusive OR 110 provides a logic LOW output Q for the overall dual clock D type flip-flop 100 as shown at point 312 of waveform (h) in FIG. 3.

The first and second single clock D type flip-flops 400a, 400b will toggle after the input signals D1 and D2, respectively, switch to logic HIGH levels, causing the combination of their respective outputs to switch between 'even' (i.e., being the same) and 'odd' (i.e., being different), and correspondingly changing the overall output signal Q of the dual clock D type flip-flop 100.

For a possible condition when both input signals D1 and D2 are at a logic HIGH level, the overall output signal Q of the dual clock D type flip-flop 100 will switch to a logic HIGH level based on the first clock signal CLK1, e.g., on a rising edge of the first clock signal CLK1, and to a logic LOW level based on the second clock signal CLK2, e.g., on a subsequent rising edge of the second clock signal CLK2.

Figure 2A:
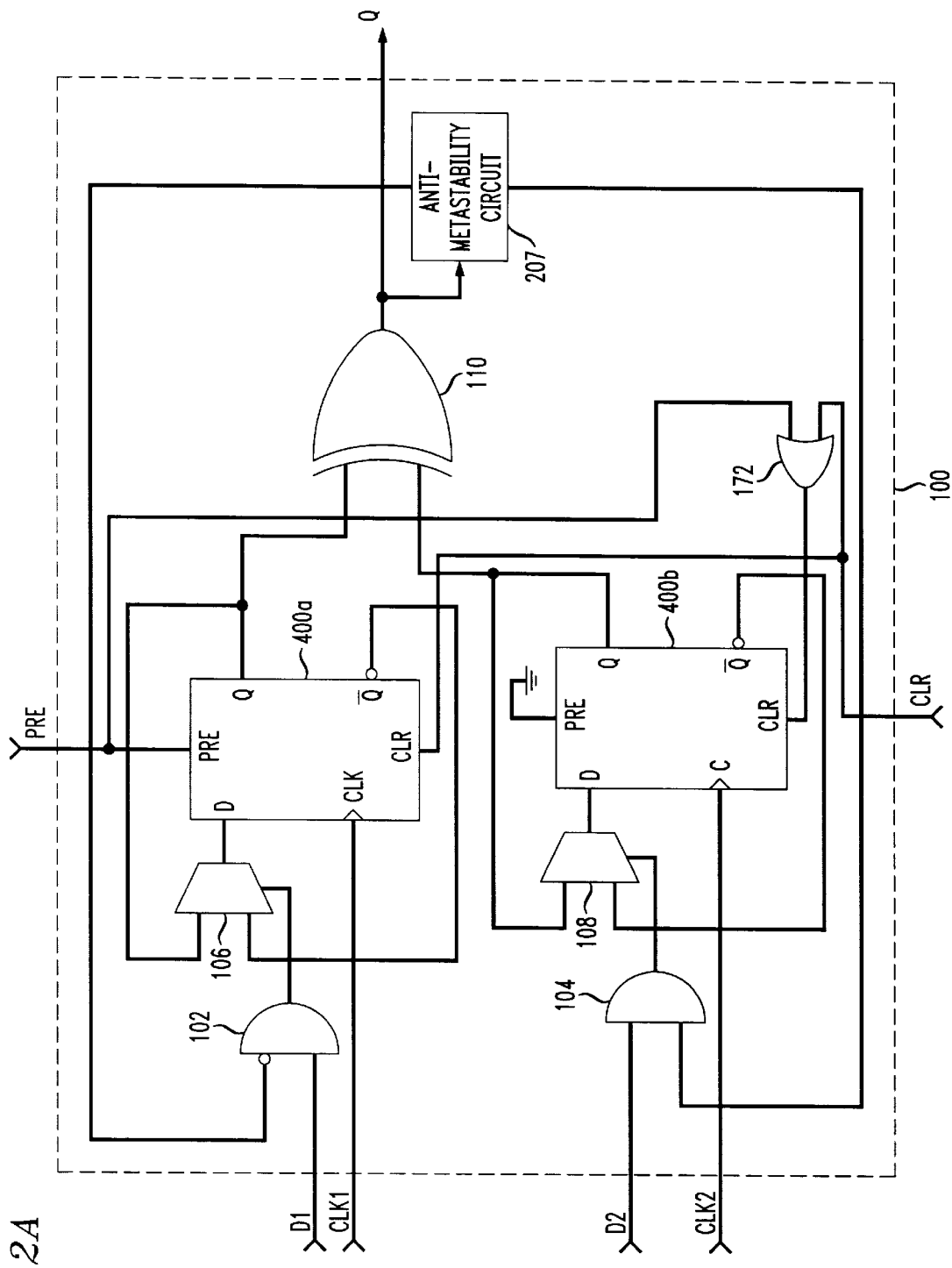
FIG. 2A is a circuit diagram of the embodiment of FIG.2, including an anti-metastability circuit.

If a metastable condition is possible due to the first clock signal CLK1 and the second clock signal CLK2 being asynchronous or with unpredictable skew, it is preferred that additional precautions be taken. For instance, a conventional shift register based anti-metastability circuit 207 (FIG. 2A) can be used in the paths between the overall output signal Q of the dual clock D type flip-flop 100 and the first and second AND gates 102, 104 to ensure the arrival of the changed level of the output signal Q synchronized to the appropriate clock signal. The synchronization can be accomplished by substantially immediately applying the output Q signal when it switches to a logic HIGH to the first AND gate 102 but delayed and synchronized by the second clock signal CLK2 to the second AND gate 104, and by substantially immediately applying the output Q signal when it switches to a logic LOW to the second AND gate 104 but delayed and synchronized by the first clock signal CLK1 to the first AND gate 102.

Accordingly, the present invention provides a D type flip-flop which outputs an active signal after the occurrence of an event on a first data input line D1 triggered by an edge (e.g., a rising edge) of a first clock signal CLK1. The output of the dual clock D type flip-flop remains active until the occurrence of another event on a second data input line D2 triggered by an edge (e.g., a rising edge) of a second clock signal CLK2, without incurring latencies normally present with prior art circuits. Thus, in accordance with the principles of the present invention, if both data inputs D1, D2 are at a logic LOW level, no change in the overall output signal Q of the dual clock D type flip-flop will occur. When the first input D1 is set to a logic HIGH logic level, the output signal Q becomes a logic HIGH level on a subsequent edge (e.g., rising edge) of the corresponding clock signal CLK1. Thereafter, until the output signal Q is cleared to a zero, the input signal D1 nor the first clock signal have no influence on the output signal Q of the dual clock D type flip-flop. When the second input signal D2 goes to a logic HIGH level, the output Q of the dual clock D type flip-flop will be cleared to a logic LOW level on a subsequent edge (e.g., rising edge) of the second clock signal CLK2. After that, and until the output signal Q is once again set to a logic HIGH level, the second input signal D2 and the second clock signal CLK2 have no influence on the output signal Q.

The present invention provides a dual clock D type flip-flop which allows state machines and interface logic to be built based on the input of two clock signals (e.g., on the edges of two clocks), whether the two clock signals be inverted from one another, skewed from one another, and/or independent signals, thus eliminating the conventional synchronizing pipeline circuitry which typically causes latencies.

While the invention has been described with reference to the exemplary embodiments thereof, those skilled in the art will be able to make various modifications to the described embodiments of the invention without departing from the true spirit and scope of the invention.

What is claimed is:

1. A dual clock flip-flop comprising:
   a first single clock flip-flop adapted to change a state of an output signal thereof based on an occurrence of an event on a data line input thereto as determined by a clock signal input thereto;
   a second single clock flip-flop adapted to change a state of an output signal thereof based on an occurrence of an event on a data line input thereto as determined by a clock signal input thereto;
   a first logic circuit to provide an output data signal for said dual clock flip-flop comprising an exclusive OR of said output signal of said first single clock flip-flop and said output signal of said second single clock flip-flop; and
   a second logic circuit comprising a multiplexer to lock out any effect of a subsequent event on said data line input to said first single clock flip-flop until after said event on said data line input to said first single clock flip-flop occurs.

2. The dual clock flip-flop according to claim 1, wherein:
   said first single clock flip-flop and said second single clock flip-flop is a D type flip-flop.

3. A method of indicating a detection of two signal events, said method comprising:
   providing an active output signal upon a first event of an edge of a first clock signal occurring during an activation of a first data signal;
   deactivating said output signal upon a second event of an edge of a second clock signal occurring during an activation of a second data signal;
   after each first event, preventing said output signal from being affected by said first clock signal and said first data signal until after a subsequent second event has occurred;
   after each second event, preventing said output signal from being affected by said second clock signal and said second data signal until after a subsequent first event has occurred; and
   using a multiplexer for locking out any effect of a subsequent activation of said first data signal until after said event on said activation of said first data signal occurs.

4. The method of indicating a detection of two signal events according to claim 3, wherein:
   said edge of said first clock signal is a rising edge.

5. The method of indicating a detection of two signal events according to claim 3, wherein:
   said edge of said second clock signal is a rising edge.

6. The method of indicating a detection of two signal events according to claim 3, further comprising:
   resetting said output signal.

7. The method of indicating a detection of two signal events according to claim 3, further comprising:
   synchronizing said output signal to an appropriate one of said first clock signal and second clock signal.

8. The method of indicating a detection of two signal events according to claim 7, wherein synchronizing an output signal to an appropriate one of said first clock signal and second clock signal further comprises:
   activating said output signal substantially immediately during activation of said first data signal and delaying applying changes in said output signal to an active state synchronous to said second clock signal during activation of said second data signal; and
   deactivating said output signal substantially immediately during activation of said second data signal and delaying applying changes in said output signal to a deactive state synchronous to said first clock signal during activation of said first data signal.

9. A dual clock D type flip-flop, comprising:
means for outputting an output signal in an active state after an occurrence of a first event on a first data input line triggered by an edge of a first clock signal;
means for maintaining a state of said output signal in an active state until a second event is detected on a second data input line based on a second clock signal;
means for deactivating said output signal upon said detection of said second event on said second data input line based on said second clock signal: and
multiplexer means for locking out any effect of a subsequent event on said first data input line until after said event on said first data input line occurs.

10. The dual clock D type flip-flop according to claim 9, wherein:
said means for outputting further maintains a state of said output signal in a deactive state until said first event is again detected on said first data input line triggered by said edge of said first clock signal.

11. The dual clock D type flip-flop according to claim 9, wherein:
said edge of said first clock signal is a rising edge.

12. The dual clock D type flip-flop according to claim 11, wherein:
said edge of said second clock signal is a rising edge.

13. The dual clock D type flip-flop according to claim 9, further comprising:
means for synchronizing said output signal to appropriate one of said first clock signal and second clock signal.

14. The dual clock D type flip-flop according to claim 13, wherein said means for synchronizing an output signal to an appropriate one of said first clock signal and second clock signal further comprises:
means for changing said output signal to an active state substantially immediately during activation of said first data signal and delaying applying changes in said output signal to an active state synchronous to said second clock signal during activation of said second data signal, said means for changing further changing said output signal to a deactive state substantially immediately during activation of said second data signal and delaying applying changes in said output signal to a deactive state synchronous to said first clock signal during activation of said first data signal.

15. Apparatus for indicating a detection of two signal events, comprising:
means for providing an active output signal upon a first event of an edge of a first clock signal occurring during an activation of a first data signal;
means for deactivating said output signal upon a second event of an edge of a second clock signal occurring during an activation of a second data signal;
means for preventing, after each first event, said output signal from being affected by said first clock signal and said first data signal until after a subsequent second event has occurred;
means for preventing, after each second event, said output signal from being affected by said second clock signal and said second data signal until after a subsequent first event has occurred; and
multiplexer means for locking out any effect of a subsequent event on said first data input line until after said event on said first data input line occurs.

16. The apparatus for indicating a detection of two signal events according to claim 15, wherein:
said edge of said first clock signal is a rising edge.

17. The apparatus for indicating a detection of two signal events according to claim 16, wherein:
said edge of said second clock signal is a rising edge.

18. The apparatus for indicating a detection of two signal events according to claim 15, further comprising:
means for clearing said output signal.

19. The apparatus for indicating a detection of two signal events according to claim 15, further comprising:
means for synchronizing said output signal to appropriate one of said first clock signal and second clock signal.

20. The apparatus for indicating a detection of two signal events according to claim 19, wherein said means for synchronizing an output signal to appropriate one of said first clock signal and second clock signal further comprises:
means for applying changes in said output signal to an active state substantially immediately during activation of said first data signal and delaying applying changes in said output signal to an active state synchronous to said second clock signal during activation of said second data signal, said means for applying changes further applying changes in said output signal to a deactive state substantially immediately during activation of said second data signal and delaying applying changes in said output signal to a deactive state synchronous to said first clock signal during activation of said first data signal.

21. A dual clock flip-flop comprising:
a first single clock flip-flop adapted to change a state of an output signal thereof based on an occurrence of an event on a first data line input thereto as determined by a clock signal input thereto;
a second single clock flip-flop adapted to change a state of an output signal thereof based on an occurrence of an event on a second data line input thereto as determined by a clock signal input thereto; and
a first logic circuit to provide an output data signal for said dual clock flip-flop comprising an exclusive OR of said output signal of said first single clock flip-flop and said output signal of said second single clock flip-flop,
a second logic circuit comprising:
a first multiplexer circuit providing said first data line input to said first single clock flip-flop; and
a second multiplexer circuit providing said second data line input to said second single clock flip-flop.

22. The dual clock flip-lip according to claim 21, wherein said second logic circuit locks out any effect of a subsequent effect of a subsequent event on said data line input to said first single clock flip-flop until after said event on said data line input to said first single clock flip-flop occurs.

23. The dual clock flip-flop according to claim 21, wherein said second logic circuit further comprises:
a first control circuit adapted to control a position of said first multiplexer circuit based on a condition of a first output data line; and
a second control circuit adapted to control a position of said second multiplexer circuit based on said condition of a second output data line.

24. The dual clock flip-flop according to claim 23, wherein:
said first control circuit and said second control circuit each comprise an AND gate.

* * * * *